(12) United States Patent
Chen (10) Patent No.: US 9,612,301 B2
(45) Date of Patent: Apr. 4, 2017

(54) HIGH-THROUGHPUT AND MOTION INSENSITIVE MRI ACCELERATED WITH MULTI-ECHO PLANAR ACQUISITION AND RELATED SYSTEMS

(75) Inventor: Nan-kuei Chen, Cary, NC (US)

(73) Assignee: Duke University, Durham, NC (US)

( * ) Notice: Subject to any disclaimer, the term of this patent is extended or adjusted under 35 U.S.C. 154(b) by 779 days.

(21) Appl. No.: 13/982,609

(22) PCT Filed: Feb. 13, 2012

(86) PCT No.: PCT/US2012/024795
§ 371 (c)(1),
(2), (4) Date: Jul. 30, 2013

(87) PCT Pub. No.: WO2012/112409
PCT Pub. Date: Aug. 23, 2012

(65) Prior Publication Data
US 2013/0307542 A1    Nov. 21, 2013

Related U.S. Application Data

(60) Provisional application No. 61/442,489, filed on Feb. 14, 2011.

(51) Int. Cl.
    *G01R 33/32*      (2006.01)
    *G01R 33/561*     (2006.01)
(52) U.S. Cl.
    CPC ......... *G01R 33/32* (2013.01); *G01R 33/5613* (2013.01); *G01R 33/5616* (2013.01)

(58) Field of Classification Search
CPC G01R 33/50; G01R 33/5613; G01R 33/5615; G01R 33/561–33/5611
See application file for complete search history.

(56) References Cited

U.S. PATENT DOCUMENTS

| 6,064,203 | A | 5/2000 | Bottomley | |
|---|---|---|---|---|
| 6,078,176 | A * | 6/2000 | McKinnon | G01R 33/56341 324/307 |
| 6,265,873 | B1 * | 7/2001 | Le Roux | G01R 33/5615 324/307 |
| 7,432,706 | B2 | 10/2008 | van der Kouwe | |
| 2001/0008376 | A1 | 7/2001 | Mock | |
| 2004/0140803 | A1 | 7/2004 | Deimling | |
| 2008/0309333 | A1 * | 12/2008 | Stehning | A61B 5/055 324/307 |

(Continued)

OTHER PUBLICATIONS

N-K, Chen, Motion-insensitive structural MRI based on Repeated Imaging with Echo-planar Navigation and Acceleration (RIENA): Demonstrated with susceptibility-weighted imaging in the presence of frequent intra-scan tremors, 2011.*

(Continued)

*Primary Examiner* — Clayton E Laballe
*Assistant Examiner* — Ruifeng Pu
(74) *Attorney, Agent, or Firm* — Myers Bigel, P.A.

(57) ABSTRACT

Methods, systems, computer programs, circuits and workstations are configured to generate MRI images using an Echo-Planar Double-Echo Steady State (EP-DESS) pulse sequence and/or a Repeated Imaging with Echo-planar Navigation and Acceleration (RIENA) pulse sequence and image processing protocol to generate clinical MRI images.

19 Claims, 7 Drawing Sheets

(56) References Cited

U.S. PATENT DOCUMENTS

2012/0025822 A1* 2/2012 Witschey ........... G01R 33/4833
                                                                                   324/309

OTHER PUBLICATIONS

Haacke et al, "Correlation of Putative Iron Content as Represented by Changes in R2* and Phase With Age in Deep Gray Matter of Healthy Adults", *J. Magn. Reson. Imaging*, 32;561-576, 2010.

Haacke et al. "Susceptibility Mapping as a Means to Visualize Veins and Quantify Oxygen Saturation", *J. Magn. Reson. Imaging*, 32:663-676, 2010.

Haacke et al. "Susceptibility Weighted Imaging (SWI)", *Magn Reson Med*, 52:612-618, 2004.

International Preliminary Report on Patentability Corresponding to International Application No. PCT/US2012/024795; Date of Mailing: Aug. 29, 2013; 6 Pages.

Pipe "Motion Correction With Propeller MRI: Application to Head Motion and Free-Breathing Cardiac Imaging", *Magn Reson Med*, 42:963-969, 1999.

Pruessmann et al. "SENSE: Sensitivity Encoding for Fast MRI", *Magn Reson Med*, 42:952-962, 1999.

Sodickson et al. "Simultaneous Acquisition of Spatial Harmonics (SMASH): Fast Imaging with Radiofrequency Coil Arrays", *Magn Reson Med*, 38:591-603, 1997.

Welch et al. "Spherical Navigator Echoes for Full 3D Rigid Body Motion Measurement in MRI", *Magn Reson Med*, 47:32-041, 2002.

International Search Report for corresponding PCT Application No. PCT/US2012/024795, mail date Sep. 25, 2012.

\* cited by examiner

FIGURE 1

"12" Ky signals refocused asymmetrically

HIGH-THROUGHPUT AND MOTION INSENSITIVE MRI ACCELERATED WITH MULTI-ECHO PLANAR ACQUISITION AND RELATED SYSTEMS

RELATED APPLICATIONS

This application is a 35 USC §371 national phase application of PCT/US2012/024795, International Filing Date Feb. 13, 2012, which claims the benefit of and priority to U.S. Provisional Application Ser. No. 61/442,489, filed Feb. 14, 2011, the contents of which are hereby incorporated by reference herein.

BACKGROUND

Magnetic resonance imaging (MRI) can be an important tool for clinical diagnosis. In some instances, in order to better characterize and stage a disease, multiple images with different contrasts are usually acquired from a patient using a series of MRI pulse sequences, such as proton-density (PD) weighted, T1-weighted, T2-weighted, and fluid attenuation with inversion recovery (FLAIR) imaging among others.

In recent years, specialized pulse sequences have been further developed to provide more sensitive and quantitative measures of physiological information. However, even though many sophisticated MRI sequences and protocols are available, it is challenging to include all the valuable pulse sequences in clinical scans for two main reasons. First, these MRI pulse sequences are often time-consuming and it is impractical to include all of the desired sequences into a single clinical scan session. Second, many of these pulse sequences are vulnerable to motion effects (common in pediatric populations and patients with Parkinson's disease, for example), making it difficult to acquire high-quality and artifact-free data.

Even though several approaches have been developed to try to improve imaging throughput or to reduce motion-related artifacts, they are still significantly limited in several ways.

Clinical MRI protocols can be accelerated with parallel imaging. See, e.g., Sodickson et al., Simultaneous acquisition of spatial harmonics (SMASH): fast imaging with radiofrequency coil arrays. Magn Reson Med, 1997 October; 38(4):591-603; and Pruessmann et al., SENSE: sensitivity encoding for fast MRI. Magn Reson Med 1999; 42(5):952-962. However, the motion artifact remains a concern in parallel MRI.

There are other motion-insensitive pulse sequences, such as PROPELLER, that are promising for producing high-quality MRI data. See, Pipe J G., Motion correction with PROPELLER MRI: application to head motion and free-breathing cardiac imaging. Magn Reson Med. 1999 November; 42(5): 963-9. However, it is believed that the associated throughput is not superior to that of existing clinical imaging protocols. As a result, it remains difficult to include many of the desired state-of-the-art sequences for clinical scans.

SUMMARY OF EMBODIMENTS OF THE INVENTION

Embodiments of the invention provide a novel Echo-Planar Double-Echo Steady State (EP-DESS) pulse sequence.

Embodiments of the invention provide a novel Repeated Imaging with Echo-planar Navigation and Acceleration (RIENA) scheme.

Embodiments of the invention can integrate two technical components: 1) a novel EP-DESS pulse sequence, and 2) a novel RIENA scheme. This integration can provide a high throughput, high SNR image that is motion-insensitive.

Embodiments of the invention are directed to methods for obtaining MRI image signals. The methods include: (i) electronically generating a pulse sequence having a defined single-shot or multi-shot segmented echo-planar gradient waveform with a first RF pulse excitation and associated first repetition time (TR) and a subsequent second RF pulse excitation and associated second TR; (ii) acquiring multiple ky lines in each RF pulse repetition time (TR) to thereby improve scan efficiency and temporal resolution; (iii) asymmetrically refocusing signals from the acquiring step in readout acquisition windows associated with the first and second excitation pulses so that, in the second and subsequent TRs, signals from two different coherent pathways, one based on the current RF pulse excitation and one based on the immediately prior RF pulse excitation, are refocused at different locations of EPI readout acquisition windows; (iv) obtaining a first echo image associated with one of the coherent pathways and a second echo image associated with the other coherent pathway; and (v) generating a composite MRI image based on data from the echo images of the obtaining step.

The generating step can create a phase accumulation value associated with the first RF pulse excitation that varies over time. The phase accumulation value immediately before initiation of the second RF pulse excitation is typically non-zero.

The generating step can create (i) a phase accumulation value associated with the signals generated by the RF pulse excitation at the current TR that varies over time during the current and immediately subsequent TRs defining a first phase accumulation pattern, with the phase accumulation value immediately before initiation of a respective immediately subsequent RF pulse excitation being non-zero, and (ii) a different phase accumulation value associated with the signals generated by the subsequent RF pulse excitation that varies over time defining a second phase accumulation pattern. The first and second phase accumulation patterns do not overlap during a respective TR, resulting in echo signal formation at different locations of a respective EPI readout acquisition window.

The first echo image is T2* weighted with a first time constant and the second echo image is also T2* weighted with a second time constant. In some embodiments, the time constants are substantially the same. In other embodiments, the first time constant is different from the second time constant.

Optionally, the method may include electronically comparing the phase values of the first and second echo images to calculate a proton resonance frequency to thereby facilitate measurement of magnetic field to allow substantially real-time temperature mapping during an MRI guided procedure.

Optionally, before the image generating step, the method may include employing a repeated imaging protocol with echo-planar navigation and acceleration (RIENA) pulse sequence to reduce or eliminate motion related artifacts in the generated image when using the multi-shot segmented EPI waveform as the EPI gradient waveform.

The RIENA pulse sequence can include: (a) acquiring either a low resolution spherical EPI navigator image or a low resolution Cartesian EPI navigator image in each of the TRs; then (b) obtaining multiple ky-lines of segmented high-resolution data with the echo-planar gradient waveform of the generating step, with an associated echo train length (ETL) chosen to accelerate acquisition without introducing noticeable EPI geometric distortions. The method may include repeating the acquiring the low resolution image and the obtaining multiple ky line steps to obtain respective multiple images with the RIENA pulse sequence, then processing the images to reduce or minimize motion related artifacts by: (c) electronically comparing the low-resolution spherical or Cartesian navigator images measured across multiple TRs to characterize patterns of intra-scan motion; (d) electronically phase-correcting the acquired k-space data in each TR period using information derived from the EPI navigator images, wherein each TR period corresponds to a single segment of multi-shot segmented EPI; and (e) electronically averaging multiple phase-corrected images to generate an image with high SNR for the generating image step.

Still other embodiments are directed to methods of generating MRI images with reduced motion induced artifacts. The methods include: (a) electronically generating an RF pulse sequence having a defined echo-planar gradient waveform with a first RF pulse excitation and associated first repetition time (TR) and subsequent second RF pulse excitations and associated TRs; (b) electronically acquiring either a low resolution spherical EPI navigator image or a low resolution Cartesian EPI navigator image in each TR; (c) electronically obtaining multiple ky-lines of segmented high-resolution k-space data with the echo-planar gradient waveform of the generating step, with an associated echo train length (ETL) chosen to accelerate acquisition without introducing noticeable EPI geometric distortions; (d) electronically comparing the low-resolution spherical or Cartesian navigator images measured across multiple TRs to characterize patterns of intra-scan motion; (e) electronically phase-correcting the acquired k-space data in each TR period using information derived from the EPI navigator images, wherein each TR period corresponds to a single segment of multi-shot segmented EPI; and (f) electronically averaging multiple phase-corrected images to generate an image with high SNR (Signal to Noise Ratio) and reduced motion-induced artifacts.

The electronically generating step gradient waveform can be a multi-shot segmented echo-planar gradient waveform. The method can further include asymmetrically refocusing signals from the acquiring step in readout acquisition windows associated with the excitation pulses so that, in the second and subsequent TRs, k space signals from two different coherent pathways, one based on the current RF pulse excitation and one based on the immediately prior RF pulse excitation, are refocused at different locations of EPI readout acquisition windows.

Still other embodiments are directed to an image processing circuit configured to electronically generate MRI images using an Echo-Planar Double-Echo Steady State (EP-DESS) pulse sequence and/or a Repeated Imaging with Echo-planar Navigation and Acceleration (RIENA) pulse sequence and image processing protocol to generate clinical MRI images.

The circuit can be configured to generate the MRI images using the EP-DESS pulse sequence by directing an MR Scanner to electronically generate a pulse sequence having a defined single-shot or multi-shot segmented echo-planar gradient waveform with a first RF pulse excitation and associated first repetition time (TR) and a subsequent second RF pulse excitation and associated second TR. The circuit can be configured to (a) acquire multiple ky lines in each RF pulse repetition time (TR) to thereby improve scan efficiency and temporal resolution, as opposed to spin warp imaging; (b) asymmetrically refocus signals in readout acquisition windows associated with the first and second excitation pulses so that, in the second and subsequent TRs, signals from two different coherent pathways, one based on the current RF pulse excitation and one based on the immediately prior RF pulse excitation, are refocused at different locations of EPI readout acquisition windows; (c) obtain a first echo image associated with one of the coherent pathways and a second echo image associated with the other coherent pathway; and (d) generate a composite MRI image based on data from the echo images of the obtaining step.

The circuit can be configured to generate an RF pulse immediately after a non-zero phase accumulation value associated with a prior RF pulse, and wherein the circuit is configured to generate the EP-DESS pulse sequence so that first and second phase accumulation patterns do not overlap during a respective TR, resulting in echo signal formation at different locations of a respective EPI readout acquisition window.

The circuit can be configured to use the RIENA protocol, and the RIENA protocol includes: (a) electronically generating an RF pulse sequence having a defined echo-planar gradient waveform with a first RF pulse excitation and associated first repetition time (TR) and subsequent second RF pulse excitations and associated TRs; (b) electronically acquiring either a low resolution spherical EPI navigator image or a low resolution Cartesian EPI navigator image in each TR; (c) electronically obtaining multiple ky-lines of segmented high-resolution k-space data with the echo-planar gradient waveform of the generating step, with an associated echo train length (ETL) chosen to accelerate acquisition without introducing noticeable EPI geometric distortions; (d) electronically comparing the low-resolution spherical or Cartesian navigator images measured across multiple TRs to characterize patterns of intra-scan motion; (e) electronically phase-correcting the acquired k-space data in each TR period using information derived from the EPI navigator images, wherein each TR period corresponds to a single segment of multi-shot segmented EPI; and (f) electronically averaging multiple phase-corrected images to generate an image with high SNR (Signal to Noise Ratio) and reduced motion-induced artifacts.

The circuit can be at least partially integrated into or in communication with at least one of: (a) the MR Scanner; or (b) a clinician workstation.

Yet other embodiments are directed to data processing systems that include non-transitory computer readable storage medium having computer readable program code embodied in the medium. The computer-readable program code including computer readable program code configured to provide at least one of the following: an Echo-Planar Double-Echo Steady State (EP-DESS) pulse sequence; and a Repeated Imaging with Echo-planar Navigation and Acceleration (RIENA) pulse sequence and image processing protocol.

The data processing system can include computer readable program code configured to generate clinical MR images using image data obtained from both the EP-DESS pulse sequence and the RIENA pulse sequence and image processing protocol to thereby generate motion-insensitive high SNR clinical images.

It is noted that aspects of the invention described with respect to one embodiment, may be incorporated in a different embodiment although not specifically described relative thereto. That is, all embodiments and/or features of any embodiment can be combined in any way and/or combination. Further, any feature or sub-feature claimed with respect to one claim may be included in another future claim without reservation and such shall be deemed supported in the claims as filed. Thus, for example, any feature claimed with respect to a method claim can be alternatively claimed as part of a system, circuit, computer readable program code or workstation. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIGS. 2A-2B are images obtained using different pulse sequences.

FIGS. 4A-4D are reconstructed images of the brain using SPGR and RIENA-based 2D SWI data, with and without the presence of intra-scan motion, in healthy volunteers. FIGS. 4A and 4B are reconstructed SPGR images, FIGS. 4C and 4D are reconstructed RIENA images. FIGS. 4B and 4D both show images obtained with frequent voluntary tremors throughout the respective scans. FIG. 4D illustrates that, in contrast to FIG. 4B, the image is free from noticeable motion related artifacts.

DETAILED DESCRIPTION

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. In the drawings, the thickness of lines, layers, features, components and/or regions may be exaggerated for clarity and broken lines illustrate optional features or operations, unless specified otherwise. Features described with respect to one figure or embodiment can be associated with another embodiment of figure although not specifically described or shown as such.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

It will be understood that although the terms "first" and "second" are used herein to describe various actions, steps or components and should not be limited by these terms. These terms are only used to distinguish one action, step or component from another action, step or component. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "circuit" refers to an entirely software embodiment or an embodiment combining software and hardware aspects, features and/or components (including, for example, a processor and software associated therewith embedded therein and/or executable by, for programmatically directing and/or performing certain described actions or method steps).

The term "programmatically" means that the operation or step can be directed and/or carried out by a digital signal processor and/or computer program code. Similarly, the term "electronically" means that the step or operation can be carried out in an automated manner using electronic components rather than manually or using any mental steps.

The terms "MRI scanner" or MR scanner" are used interchangeably to refer to a Magnetic Resonance Imaging system and includes the high-field magnet and the operating components, e.g., the RF amplifier, gradient amplifiers and processors that typically direct the pulse sequences and select the scan planes. Examples of current commercial scanners include: GE Healthcare: Signa 1.5T/3.0T; Philips Medical Systems: Achieva 1.5T/3.0T; Integra 1.5T; Siemens: MAGNETOM Avanto; MAGNETOM Espree; MAGNETOM Symphony; MAGNETOM Trio; and MAGNETOM Verio. As is well known, the MR scanner can include a main operating/control system that is housed in one or more cabinets that reside in an MR control room while the MRI magnet resides in the MR scan suite. The control room and scan room can be referred to as an MR suite and the two rooms can be separated by an RF shield wall. The term "high-magnetic field" refers to field strengths above about 0.5 T, typically above 1.0 T, and more typically between about 1.5 T and 10 T. Embodiments of the invention may be particularly suitable for 1.5 T and 3.0 T systems, or higher field systems such as future contemplated systems at 4.0 T, 5.0 T, 6.0 T and the like. The methods and systems can also be applied to animal MRI data acquired from animal MRI scanners. The term "patient" refers to humans and animals.

The term "automatically" means that the operation can be substantially and typically entirely, carried out without manual input, and is typically programmatically directed and/or carried out. The term "electronically" with respect to connections includes both wireless and wired connections between components.

The term "clinician" means physician, radiologist, physicist, or other medical personnel desiring to review medical data of a patient.

The term "reconstruction" is used broadly to refer to original or post-acquisition and storage and subsequent construction of image slices or images of an image data set.

The terms "protocol" and "scheme" are used interchangeably and refer to an automated electronic algorithm (typically a computer program) with mathematical computations, defined rules for data interrogation and analysis that manipulates MRI image data to generate (clinical) MRI images.

The term "composite MRI image" refer to an MRI images that is rendered, reconstructed or otherwise generated using at least two sets of image data, for example from respective different echo images in an acquisition window or windows.

The term "low resolution" refers to an image obtained with less than full resolution, typically with voxel size of about 10 mm isotropic. The term "high SNR (Signal to Noise Ratio)" refers to an image with a noise level sufficiently low so as to not interfere with identification of anatomy and/or pathology for clinical diagnosis.

The term "high throughput" refers to fast scan protocols that can allow for shorter and/or more efficient scan sessions and/or increased numbers of patients to be evaluated by a single MR Scanner as compared with conventional MRI protocols. The reconstruction or post-signal collection analysis can be done while the patient is in the Scanner but is typically carried out, at least partially, after the patient exits the Scanner.

Each article, reference and patent cited or discussed herein is hereby incorporated by reference as if recited in full herein.

Embodiments of the present invention may take the form of an entirely software embodiment or an embodiment combining software and hardware aspects, all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on another computer, local and/or remote or entirely on the other local or remote computer. In the latter scenario, the other local or remote computer may be connected to the user's computer through a local area network (LAN) or a wide area network (WAN), or the connection may be made to an external computer (for example, through the Internet using an Internet Service Provider).

Embodiments of the present invention are described herein, in part, with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, or a block divided and performed separately, depending upon the functionality involved.

Embodiments of the invention recognize that several cardiac MRI studies have shown that high-throughput MRI with reduced motion sensitivity may be achieved through integrating segmented echo-planar imaging (EPI) waveforms and conventional spin-warp imaging (e.g., spoiled gradient recalled (SPGR) imaging; balanced steady-state free procession (bSSFP) imaging among others). Even though the integration of EPI based acceleration and high-resolution spin-warp imaging sequences (e.g., SPGR and bSSFP) has a great potential for high-throughput clinical scans, it has several major limitations. For example, the data produced from the integration of EPI based acceleration and SPGR usually have a lower signal-to-noise ratio (SNR). The reason is that the SPGR type sequences only preserve the signals excited from the RF pulse in the current TR, while the high-order signals generated from previous TRs are eliminated with crusher gradients. Second, in contrast to SPGR, the bSSFP sequence preserves signals from multiple coherent pathways and thus can produce data with a significantly improved SNR. However, the bSSFP is sensitive to $B_0$ field inhomogeneities and highly susceptible to undesirable banding artifacts. As a result, the scan parameters are significantly restricted (particularly the choice of TR) when integrating echo-planar based acceleration and bSSFP. In addition, the imaging throughput may be improved by integrating EPI and spin-warp imaging, but the integrated protocols are still susceptible to motion related artifacts.

Figure 4A:
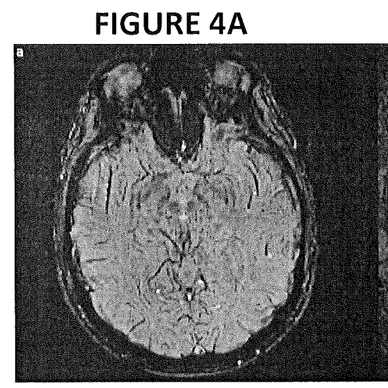
Figure 4B:
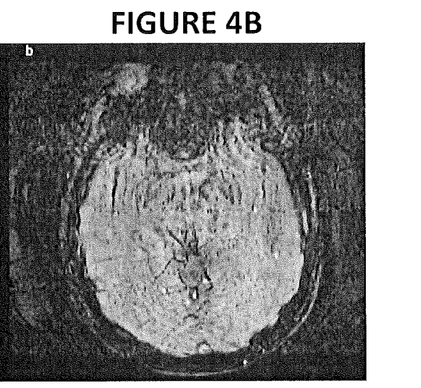
Figure 4C:
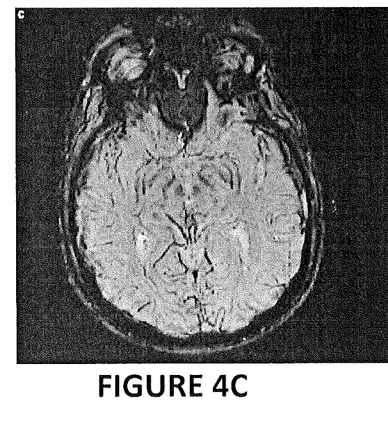
Figure 4D:
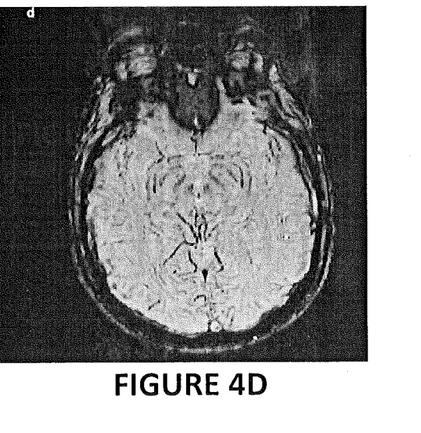

Recognizing and addressing the above mentioned limitations, embodiments of the invention can provide new approaches to facilitate one or more of high-throughput, high-SNR and motion-insensitive clinical MRI. The approaches can use one of two technical components, separately or can integrate the two technical components to work synergistically together: 1) a novel Echo-Planar Double-Echo Steady State (EP-DESS) pulse sequence (20, FIG. 1), and 2) a novel Repeated Imaging with Echo-planar Navigation and Acceleration (RIENA) scheme (30, FIG. 4B), as described below which can simultaneously allow for high-throughput, high-SNR and motion insensitive clinical MRI.

Figure 1:
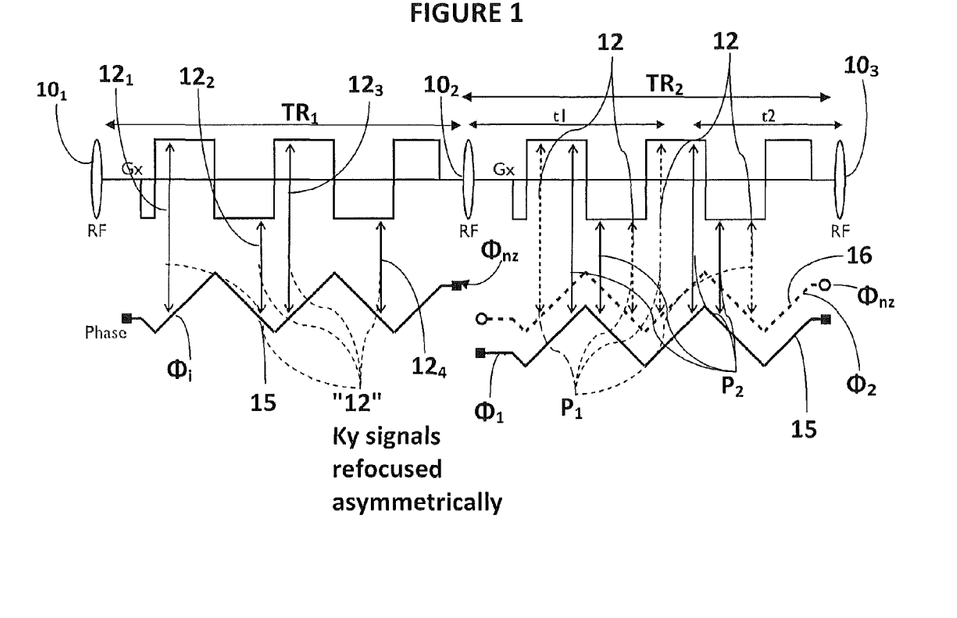
FIG. 1 is a schematic diagram of an example of an EP-DESS pulse sequence according to embodiments of the present invention.

For example, FIG. 1 shows that, after the first RF pulse excitation $10_1$, four ky lines are acquired in a TR ($TR_1$), and the k-space signals 12 (these signals or signal data are generally noted as 12 and, in this example, as there are four, identified as $12_1$-$12_4$) are refocused asymmetrically (indicated by vertical dashed lines) in four readout acquisition windows. The acquisition of multiple k-pace signals in each TR (and acquisition window) can improve scan efficiency and temporal resolution. For the example shown in $TR_2$ in FIG. 1, there are 4 echoes generated by 10_1 RF pulse, and 4 echoes generated by 10_2 RF pulse (so there are 8 vertical dashed lines in $TR_2$).

Note that the gradient waveforms Gx are designed such that the accumulated phase value $\Phi_1$ (lower curve 15) is non-zero $\Phi$nz immediately before the second RF pulse $10_2$. After the second RF pulse excitation $10_2$, two coherent pathways $P_1$, $P_2$ exist in the second TR period $TR_2$. The $P_1$ pathway (lighter lines) reflects k-space signals 12 resulting from the second RF pulse $TR_2$, and the second pathway $P_2$ reflects k-space signals 12 resulting from the immediately previous RF pulse, here $TR_1$. It can be seen that, because of different phase accumulation patterns 15, 16, for respective $\Phi_1$ (lower curve 15) and $\Phi2$ (upper curve), the signals 12 from these two coherent pathways $P_1$, $P_2$ are refocused at different locations of the readout acquisition windows. First and second echo images can be obtained, the first associated with one of the coherent pathways and the second associated with the other coherent pathway. The two echo images can be used to generate a composite MRI image.

The spacing of the signals shown in FIG. 1 for the first and second TRs for the current excitation pulse is by way of example only. In this example, the first k-space signal $12_1$ is in the first part of the first acquisition window, the second $12_2$ is in the last part of the second acquisition window, the third $12_3$ is in the first part of the third acquisition window and the fourth $12_4$ is in the last part of the fourth acquisition window. The immediately prior signals in a respective acquisition window typically lag the current signals. Other asymmetric k-space refocusing patterns may be used The phase accumulation value associated with the signals generated by the RF pulse excitation at the current TR (e.g., $TR_2$) varies over time during the current and immediately subsequent TR defining a first phase accumulation pattern. The phase accumulation value immediately before initiation of a respective immediately subsequent RF pulse excitation is non-zero) $\Phi$nz. A different phase accumulation value associated with the signals generated by the subsequent RF pulse excitation varies over time defining a second phase accumulation pattern. The first and second phase accumulation patterns 15, 16 do not overlap during a respective TR, resulting in echo signal formation at different locations of a respective EPI readout acquisition window.

As shown, the RF pulse sequence 10 is typically repeated several times, shown as at least three times $10_1$, $10_2$, $10_1$ Again, although not shown, k-space signals 12 associated with the immediately prior excitation pulse sequence ($10_2$) as well as those associated with the current excitation pulse sequence ($10_3$) are asymmetrically refocused in the same manner as before. The signals 12 again form two different coherent pathways 15, 16, one based on the current RF pulse excitation and one based on the immediately prior RF pulse excitation that are refocused at different locations of EPI readout acquisition windows.

The summation of magnitude echo-planar imaging balanced steady-state free procession, EPI-bSSFP, images corresponding to two different coherent pathways $P_1$, $P_2$ can generate an artifact-free and high-SNR (composite) image.

In some embodiments, the echo image data can be analyzed to extract other clinically useful information. For example, the complex values of two echo-images contain other useful information, which may be used to dynamically measure the proton resonance frequency. In FIG. 1, the first echo-image (i.e., the lighter line pathway $P_1$ in the second TR $10_2$) is T2*-weighted, with a time constant t1, and the second echo-image (i.e., the darker pathway $P_2$ in the second TR $10_2$) is also T2*-weighted but with a different time constant t2. By comparing the phase values of the two complex images with different T2*-weighting, the proton resonance frequency can be calculated. The proton resonance frequency data can be used for temperature mapping in MR guided surgeries such as therapies.

In some embodiments, multi-echo SSFP sequences have been shown to be able to produce 1) artifact-free and high-SNR images by summing the magnitude signals from separated echo-images, and 2) different echo-images contain different T2*-weightings and different image-domain phase values.

Figure 2A:
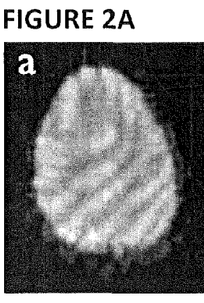
FIG. 2A is an image obtained using the conventional repeated single-shot EPI-bSSFP.
Figure 2B:
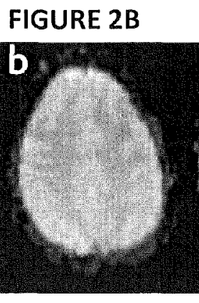
FIG. 2B is an image obtained using our single-shot EP-DESS.
Figure 2C:
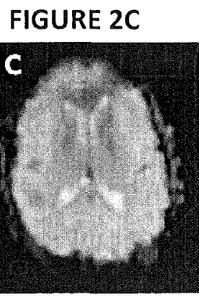
FIG. 2C-2D show two images reconstructed from different coherent pathways, which can be separated with the new EP-DESS sequence, providing different contrasts and improved tissue segmentation.
Figure 2D:
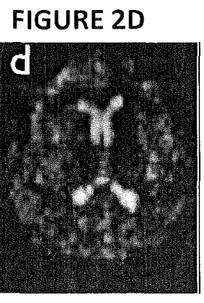

FIGS. 2A and B show a conventional repeated single-shot EPI-bSSFP and a repeated single-shot EP-DESS, respectively, obtained from a healthy adult volunteer. As shown in FIG. 2A, the conventional single-shot EPI-bSSFP, obtained at long TR (90 msec) and TE (45 msec), is affected by pronounced banding artifacts due to the destructive phase interference from multiple echo coherence pathways. In contrast, the single-shot EPI-DESS can produce data of comparably high SNR but free from banding artifacts (FIG. 2B: the magnitude summation of signals from two echo-pathways). FIGS. 2C and D demonstrate that different contrasts can be achieved with two echo images of EP-DESS. Single-shot EP-DESS of this particular set of parameters enables discrimination of cerebrospinal fluid (highlighted in FIG. 2D) from the brain parenchyma in a simultaneous multi-contrast data set.

Once the high-throughput and high-SNR imaging is achieved by EP-DESS, it can be further integrated with a new acquisition and reconstruction scheme termed, repeated imaging with echo-planar navigation and acceleration (RIENA), to reduce, if not eliminate, motion related artifacts even in challenging patient populations such as pediatric populations or patients without the ability to control movement during a scan.

Repeated Imaging with Echo-Planar Navigation and Acceleration (RIENA)

Repeated Imaging with Echo-planar Navigation and Acceleration (RIENA), can generally be applied to various structural MRI scans (e.g., T1-weighted imaging; and T2-weighted imaging among others) when appropriate magnetization preparation schemes are used. As a proof of concept, the application of RIENA to significantly reduce motion related artifacts in SPGR-based susceptibility-weighted imaging (SWI: which is sensitive to motion due to its longer scan time) even in the presence of frequent or continual intra-scan tremors (common in patients with advanced Parkinson's disease) has been demonstrated.

Figure 3A:
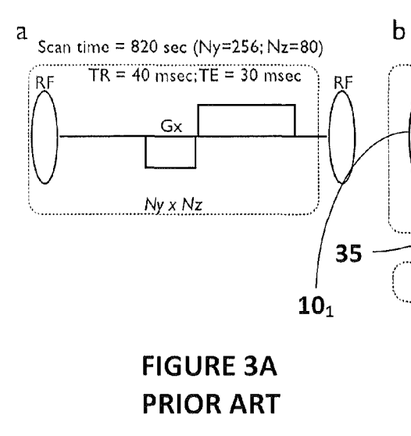
FIG. 3A is a schematic illustration of a prior art protocol (T2*-weighted SPGR) with parameters selected for SWI applications.
Figure 3B:
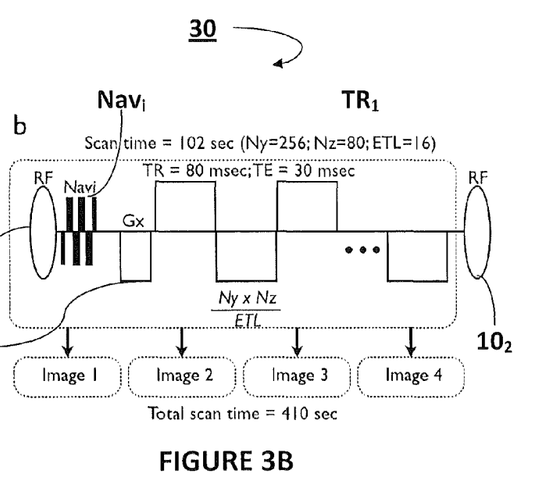
FIG. 3B is a schematic illustration of a RIENA pulse sequence with parameters selected for SWI applications.

FIGS. 3A and 3B schematically compare T2*-weighted SPGR and the RIENA pulse sequences (30), respectively, with their parameters optimized for SWI applications. In regular SPGR-based SWI (FIG. 3A), a low readout bandwidth (e.g., ~16 kHz) is chosen to improve the signal-to-noise ratio (SNR), and the unused time periods are significant, as shown in FIG. 3A. As a result, the scan efficiency is usually low, and the scan time is long (e.g., ~820 sec; with Ny=256, Nz=80 and TR=40 msec) in SPUR-based SWI. See, e.g., Haacke E M, Miao Y, Liu M, Habib C A, Katkuri Y, Liu T, Yang Z, Lang Z, Hu J, Wu J. Correlation of putative iron content as represented by changes in R2* and phase with age in deep gray matter of healthy adults. J Magn Reson Imaging. 2010 September; 32(3): 561-76; Haacke E M, Xu Y, Cheng Y C, Reichenbach J R. Susceptibility weighted imaging (SWI). Magn Reson Med. 2004 September; 52(3): 612-8; and Haacke E M, Tang J, Neelavalli J, Cheng Y C. Susceptibility mapping as a means to visualize veins and quantify oxygen saturation. J Magn Reson Imaging, 2010 September; 32(3): 663-76.

In each TR (TR$_1$ is shown in FIG. 3B) of the RIENA sequence 30, a low-resolution spherical or Cartesian navigator image Nav$_i$ (gradient waveforms immediately after the RF excitation pulse 10$_1$ in FIG. 3B) is first acquired. See, e.g., Welch E B, Manduca A, Grimm R C, Ward H A, Jack C R Jr. Spherical or Cartesian navigator echoes for full 3D rigid body motion measurement in MRI. Magn Reson Med. 2002 January; 47(1):32-41. Multiple ky-lines of segmented high-resolution data are then obtained with echo-planar waveforms, with its echo train length (ETL) chosen to accelerate acquisition without introducing noticeable EPI geometric distortions. With this scheme, the acquisition time of RIENA can be significantly reduced (e.g., 102 sec; with Ny=256, Nz=80, ETL=32 and TR=80 msec) as compared with 3D SPGR. As shown in FIG. 3B, the RIENA pulse sequence 30 can be repeatedly used to serially acquire multiple images (shown as Image 1, Image 2, Image 3 and Image 4).

Multiple images and/or associated image data obtained with the RIENA pulse sequence 30 can be processed with the following procedures to reduce or minimize motion related artifacts. First, low-resolution spherical or Cartesian navigator images measured across multiple TRs are compared to characterize the patterns of intra-scan motion. Second, the acquired k-space data in each TR period (i.e., corresponding to a single segment of multi-shot segmented EPI) are phase-corrected using the information derived from navigators. Third, multiple phase-corrected images are then averaged to generate an image with high SNR. Note that the residual ghost artifacts are incoherent across TRs, and thus can be further reduced when averaging multiple complex-RIENA images.

The SPGR- and RIENA-based 2D SWI data have been experimentally compared, with and without the presence of intra-scan motion, in healthy volunteers. The subjects were asked to remain very still for the first set of SPGR and RIENA scans. In the second set of SPGR and RIENA scans, the subjects had frequent voluntary tremors throughout the whole scans (~5 mm displacement at ~3 Hz). The reconstructed SPGR and RIENA images were then compared in terms of the SNR and motion related artifacts.

The upper and lower panels of FIG. 4 compare the SPGR (FIGS. 4A and 4B) and RIENA (FIG. 4C and FIG. 4D) images. First, in the absence of intra-scan motion (left column), SPGR (FIG. 4A) and RIENA (FIG. 4C) images have comparable quality and SWI contrast. However, in the presence of frequent intra-scan tremors (right column), the SPGR image is corrupted by ghost artifacts (FIG. 4B). On the other hand, the image reconstructed with the RIENA algorithm (FIG. 4D) is free from noticeable motion related artifacts.

As compared with the conventional structural MRI sequences (e.g., SPGR), the developed RIENA technique has higher scan efficiency, making it possible to acquire multiple images with a reduced scan time. Using the embedded navigator within each TR, the intra-scan motion can be characterized and used to phase-correct each k-space segment of multi-shot segmented EPI. Furthermore, the obtained multiple complex RIENA images can be averaged to enhance the SNR and to reduce the motion related artifacts that are incoherent across multiple TRs. Note that the RIENA sequence uses a longer TR, typically at least about 80 ms and thus has a lower specific absorption rate (SAR) value as compared with the SPUR. The proposed RIENA method can generally be applied to various structural MRI scans (e.g., T1-weighted and T2-weighted among others) when appropriate magnetization preparation schemes are incorporated.

Embodiments of the invention contemplate integration of EP-DESS and RIENA. The EP-DESS pulse sequence allows for high-SNR and high-throughput imaging, and the RIENA scheme allows for motion-insensitive MRI. EP-DESS and RIENA are compatible with each other and they can be integrated to allow for high-throughput, high-SNR and motion-insensitive clinical MRI of the next generation. Specifically, this integration can be achieved by using the EP-DESS sequence 20 (FIG. 1) as the readout acquisition waveforms in RIENA 20 (FIG. 3B, the readout acquisition waveforms are shown inside the rectangular dashed line). For example, 1) the pre-phasing readout gradient waveform Gx (35 in FIG. 3B) will be adjusted in a way that the echoes generated by the RF pulse in the current TR will be focused asymmetrically within each EPI readout gradient window, similar to what is shown by four vertical dashed lines in $TR_1$ of FIG. 1; 2) the accumulated phases corresponding to signals from the current RF pulse excitation will be non-zero immediately before the application of the subsequent RF pulse (e.g., $10_2$ in FIG. 1); 3) the echoes generated by the current and the previous RE pulses will be focused at different locations of EPI readout windows, similar to that is shown by 8 vertical dashed lines in $TR_2$ of FIG. 1; 4) For the first EP-DESS echo image: phase inconsistency across multiple TR, caused by motion, will be corrected by using information derived from the embedded navigator echo (Navi in FIG. 3B), before combining different k-space segments across multiple TRs; 5) For the second EP-DESS echo image: phase inconsistency across multiple TR, caused by motion, can be reduced by using information derived from the embedded navigator echo (Navi in FIG. 3B), before combining different k-space segments across multiple TRs; 6) multiple whole k-space data sets can be acquired and averaged in complex-domain to further reduce motion-related artifacts in each of the two echo images; 7) The two echo images produced by integrated EP-DESS and RIENA scheme can be further combined, in magnitude domain, to produce a composite image of high-SNR and without banding artifact.

Figure 5A:
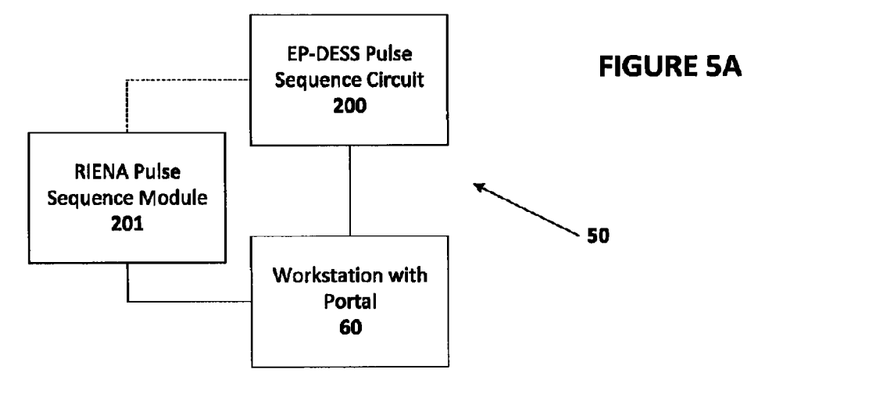
FIGS. 5A-5C are schematic illustrations of systems that can be used to provide the novel pulse sequences and reconstruction schemes according to embodiments of the present invention.
Figure 5B:
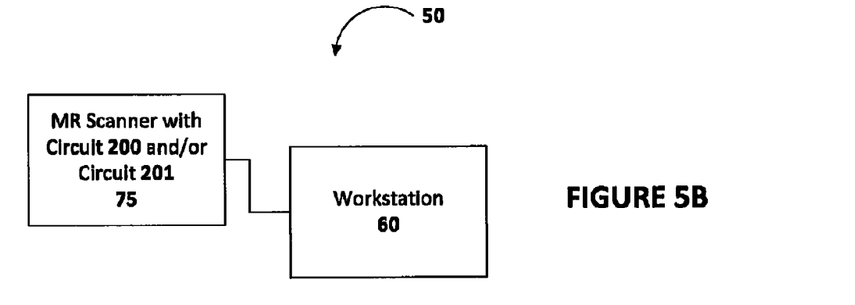
Figure 5C:
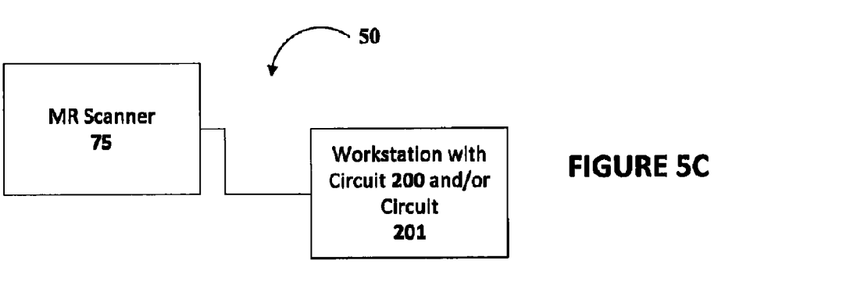

FIGS. 5A-5C illustrate exemplary image processing systems 50 with an EP-DESS module or circuit 200 and/or a RIENA module or circuit 201. FIG. 5A illustrates that the system 50 can include at least one workstation 60 that has a portal for accessing the module or circuit 200 and/or 201. One or both of the circuits 200, 201 can be held on a remote server accessible via a LAN, WAN or Internet. The workstation 60 can communicate with patient image data which may be held in a remote or local server, in the Scanner or other electronically accessible database or repository. The workstation 60 can include a display with a GUI (graphic user input) and the access portal. The workstation can access the data sets via a relatively broadband high speed connection using, for example, a LAN or may be remote and/or may have lesser bandwidth and/or speed, and for example, may access the data sets via a WAN and/or the Internet. Firewalls may be provided as appropriate for security.

FIG. 5B illustrates that one or both of the circuits 200, 201 can be included in the MR Scanner 75 which can communicate with a workstation 60. One or both of the circuits 200, 201 can be integrated into the control cabinet with image processing circuitry: FIG. 5C illustrates that one or both of the circuits 200, 201 can be integrated into one or more local or remote workstations 60 that communicates with the Scanner 75. Although not shown, parts of one or both of the circuits 200, 201 can be held on both the Scanner 75 and one or more workstations 60, which can be remote or local.

Figure 6:
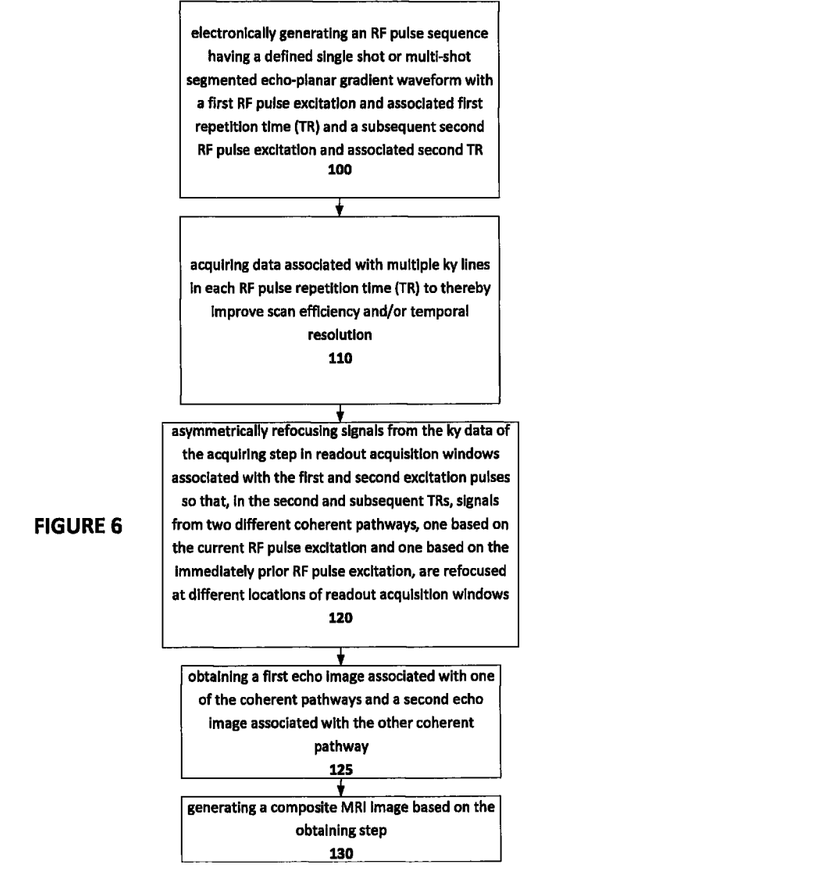
FIG. 6 is a flow chart of exemplary operations that can be used to generate images according to embodiments of the present invention.

FIG. 6 illustrates exemplary steps that can be taken to carry out embodiments of the invention. As shown, an RF pulse sequence having a defined single shot or multi-shot segmented echo-planar gradient waveform with a first RF pulse excitation and associated first repetition time (TR) and a subsequent second RF pulse excitation and associated second TR is electronically generated (block 100). Data associated with multiple ky lines in each RF pulse repetition time (TR) is acquired to thereby improve scan efficiency and/or temporal resolution (block 110). Signals from the ky data of the acquiring step are assymetrcially refocused in readout acquisition windows associated with the first and second excitation pulses so that, in the second and subsequent TRs, signals from two different coherent pathways, one based on the current RF pulse excitation and one based on the immediately prior RF pulse excitation, are refocused at different locations of readout acquisition windows (block 120). A first echo image associated with one of the coherent pathways and a second echo image associated with the other coherent pathway are obtained (block 125). A composite MRI image is generated based on the obtaining step (block 130).

Figure 7:
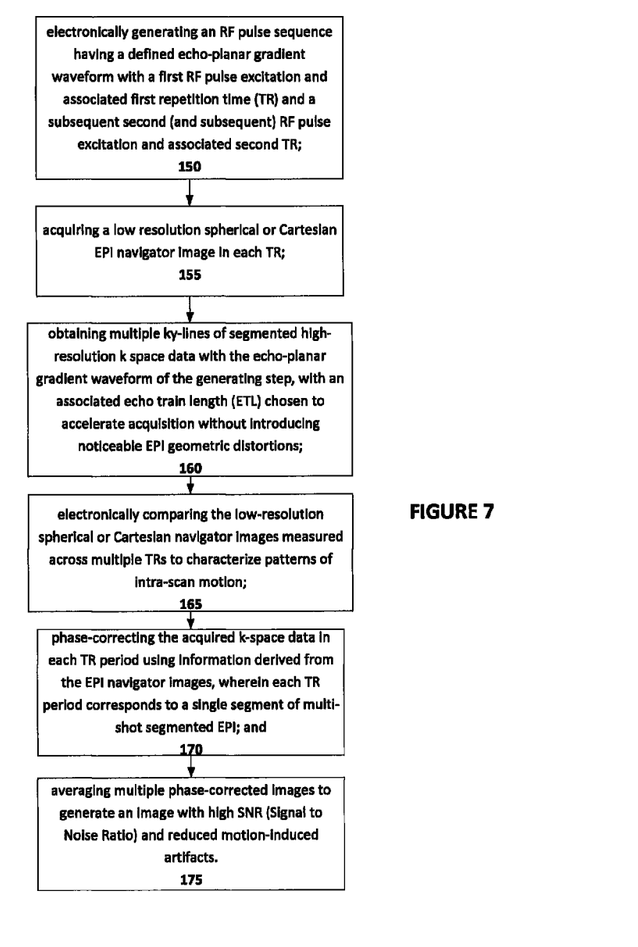
FIG. 7 is a flow chart of other exemplary operations that can be used to generate images according to embodiments of the present invention.

FIG. 7 illustrates exemplary steps that can be taken to carry out embodiments of the invention. An RF pulse sequence is electronically generated (and transmitted), the pulse sequence has a defined echo-planar gradient waveform with a first RF pulse excitation and associated first repetition time (TR) and a subsequent second RF pulse excitation and associated second TR (block 150). A low resolution spherical or Cartesian EPI navigator image is acquired in each TR (block 155). Multiple ky-lines of segmented high-resolution k space data with the echo-planar gradient waveform of the generating step are obtained, with an associated echo train length (ETL) chosen to accelerate acquisition without introducing noticeable EPI geometric distortions (block 160). The low-resolution spherical or Cartesian navigator images are compared, measured across multiple TRs, to characterize patterns of intra-scan motion (block 165). The acquired k-space data in each TR period is phase-corrected using information derived from the EPI navigator images, wherein each TR period corresponds to a single segment of multi-shot segmented EPI (block 170). Multiple phase-corrected images are averaged to generate an image with high SNR (Signal to Noise Ratio) and reduced motion-induced artifacts (block 175).

Figure 8:
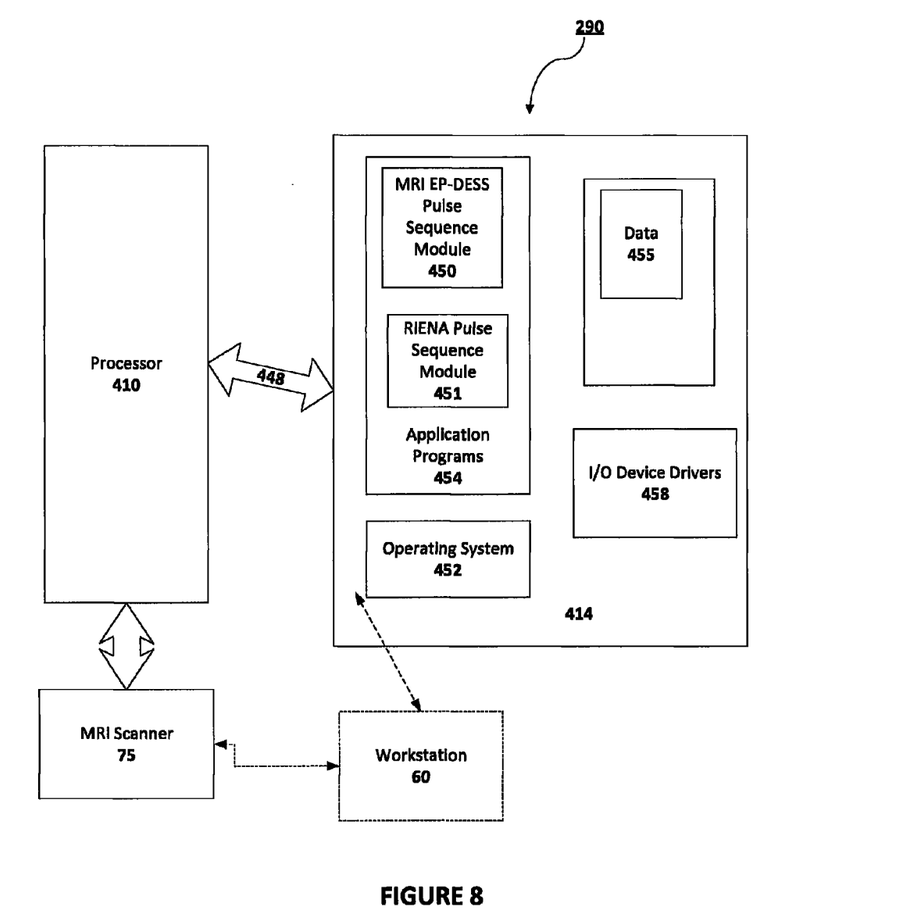
FIG. 8 is a schematic illustration of a data processing system according to embodiments of the present invention.

FIG. 8 is a schematic illustration of a data processing system 290. The system 290 can be used with any of the systems 50 and provide all or part of the circuit 200 and/or circuit 201. The data processing systems 290 data processing systems may be incorporated in a digital signal processor in any suitable device or devices. As shown in FIG. 8, the processor 410 can communicate with an MRI scanner 75 and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

FIG. 8 illustrates that the memory 414 may include several categories of software and data used in the data processing system: the operating system 452; the application programs 454; the input/output (I/O) device drivers 458; and data 455. The data 455 can include patient-specific MRI image data. FIG. 8 also illustrates the application programs 454 can include an MRI EP-DESS Module 450 and/or RIENA Module 451 The data processing system may be particularly suitable for imaging of the heart, lungs and/or brain and/or for imaging patients having motion control problems (e.g., pediatric patients or patients with shaking, tremors, convulsions and the like).

As will be appreciated by those of skill in the art, the operating systems 452 may be any operating system suitable for use with a data processing system, such as OS/2, AIX, DOS, OS/390 or System390 from International Business Machines Corporation, Armonk, N.Y., Windows CE, Windows NT, Windows95, Windows98, Windows2000, WindowsXP or other Windows versions from Microsoft Corporation, Redmond, Wash., Unix or Linux or FreeBSD, Palm OS from Palm, Inc., Mac OS from Apple Computer, Lab- View, or proprietary operating systems. The I/O device drivers 458 typically include software routines accessed through the operating system 452 by the application programs 454 to communicate with devices such as I/O data port(s), data storage 455 and certain memory 414 components. The application programs 454 are illustrative of the programs that implement the various features of the data (image) processing system and can include at least one application, which supports operations according to embodiments of the present invention. Finally, the data 455 represents the static and dynamic data used by the application programs 454, the operating system 452, the I/O device drivers 458, and other software programs that may reside in the memory 414.

While the present invention is illustrated, for example, with reference to the Module 450 and 451 being an application program in FIG. 8, as will be appreciated by those of skill in the art, other configurations may also be utilized while still benefiting from the teachings of the present invention. For example, the Module 450, 451 may also be incorporated into the operating system 452, the I/O device drivers 458 or other such logical division of the data processing system. Thus, the present invention should not be construed as limited to the configuration of FIG. 8 which is intended to encompass any configuration capable of carrying out the operations described herein. Further, Module 450, 451 can communicate with or be incorporated totally or partially in other components, such as an MRI scanner 75, interface/gateway or workstation 60.

The I/O data port can be used to transfer information between the data processing system, the workstation, the MRI scanner, the interface/gateway and another computer system or a network (e.g., the Internet) or to other devices or circuits controlled by the processor. These components may be conventional components such as those used in many conventional data processing systems, which may be configured in accordance with the present invention to operate as described herein.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method for obtaining MRI image signals, comprising:
    electronically generating a pulse sequence having a defined single-shot or multi-shot segmented echo-planar gradient waveform with a first RF pulse excitation and associated first repetition time (TR) and at least one subsequent RF pulse excitation and associated TR including a subsequent second RF pulse excitation and associated second TR;
    acquiring multiple ky lines in each RF pulse TR to thereby improve scan efficiency and temporal resolution;
    asymmetrically refocusing signals from the acquiring step in readout acquisition windows associated with at least the first and second excitation pulses so that, in the second and any subsequent TRs, signals from two different coherent pathways, one based on a current RF pulse excitation and one based on an immediately prior RF pulse excitation, are refocused at different locations of EPI readout acquisition windows;
    obtaining a first echo image associated with one of the coherent pathways and a second echo image associated with the other coherent pathway; and
    generating a composite MRI image based on data from the echo images of the obtaining step.

2. The method of claim 1, wherein the generating step creates a phase accumulation value associated with the first RF pulse excitation that varies over time, and wherein the phase accumulation value immediately before initiation of the second RF pulse excitation is non-zero.

3. The method of claim 1, wherein the generating step creates (i) a phase accumulation value associated with the signals generated by the RF pulse excitation at a current TR that varies over time during the current and immediately subsequent TRs defining a first phase accumulation pattern, wherein the phase accumulation value immediately before initiation of a respective immediately subsequent RF pulse excitation is non-zero, and (ii) a different phase accumulation value associated with the signals generated by the immediately subsequent RF pulse excitation that varies over time defining a second phase accumulation pattern, wherein the first and second phase accumulation patterns do not overlap during a respective TR, resulting in echo signal formation at different locations of a respective EPI readout acquisition window.

4. The method of claim 1, wherein the first echo image is T2* weighted with a first time constant and the second echo image is also T2* weighted with a second time constant, wherein the time constants are substantially the same.

5. The method of claim 1, wherein the first echo image is T2* weighted with a first time constant and the second echo image is also T2* weighted with a second time constant, wherein the first time constant is different from the second time constant.

6. The method of claim 5, further comprising electronically comparing the phase values of the first and second echo images to calculate a proton resonance frequency to thereby facilitate measurement of magnetic field to allow substantially real-time temperature mapping during an MRI guided procedure.

7. The method of claim 1, further comprising, before the image generating step, employing a repeat imaging protocol, with a repeat imaging echo-planar navigation and acceleration (RIENA) pulse sequence to reduce or eliminate motion related artifacts in the generated image when using the multi-shot segmented EPI waveform as the EPI gradient waveform.

8. The method of claim 7, wherein the RIENA pulse sequence includes:
    acquiring a low resolution spherical or Cartesian EPI navigator image in each of the TRs; then
    obtaining multiple ky-lines of segmented high-resolution data with the echo-planar gradient waveform of the generating step, with an associated echo train length (ETL) chosen to accelerate acquisition without introducing noticeable EPI geometric distortions.

9. The method of claim 8, further comprising repeating the acquiring the low resolution image and the obtaining multiple ky line steps to obtain respective multiple images with the RIENA pulse sequence, then processing the images to reduce or minimize motion related artifacts by:
- electronically comparing the low-resolution spherical or Cartesian navigator images measured across multiple TRs to characterize patterns of intra-scan motion;
- electronically phase-correcting the acquired k-space data in each TR period using information derived from the EPI navigator images, wherein each TR period corresponds to a single segment of multi-shot segmented EPI; and
- electronically averaging multiple phase-corrected images to generate an image with high SNR for the generating image step.

10. A method of generating MRI images with reduced motion induced artifacts, comprising:
- electronically generating an RF pulse sequence having a defined echo-planar gradient waveform with a first RF pulse excitation and associated first repetition time (TR) and subsequent second RF pulse excitations and associated TRs;
- electronically acquiring a low resolution spherical or Cartesian EPI navigator image in each TR;
- electronically obtaining multiple ky-lines of segmented high-resolution k-space data with the echo-planar gradient waveform of the generating step, with an associated echo train length (ETL) chosen to accelerate acquisition without introducing noticeable EPI geometric distortions;
- electronically comparing the low-resolution spherical or Cartesian navigator images measured across multiple TRs to characterize patterns of intra-scan motion;
- electronically phase-correcting the acquired k-space data in each TR period using information derived from the EPI navigator images, wherein each TR period corresponds to a single segment of multi-shot segmented EPI; and
- electronically averaging multiple phase-corrected images to generate an image with high SNR (Signal to Noise Ratio) and reduced motion-induced artifacts.

11. The method of claim 10, wherein the electronically generating step gradient waveform comprises a multi-shot segmented echo-planar gradient waveform, the method further comprising:
- asymmetrically refocusing signals from the acquiring step in readout acquisition windows associated with the excitation pulses so that, in the second and subsequent TRs, k space signals from two different coherent pathways, one based on the current RF pulse excitation and one based on the immediately prior RF pulse excitation, are refocused at different locations of EPI readout acquisition windows.

12. An image processing circuit configured to electronically generate MRI images using an Echo-Planar Double-Echo Steady State (EP-DESS) pulse sequence and/or a Repeated Imaging with Echo-planar Navigation and Acceleration (RIENA) pulse sequence and image processing protocol to generate clinical MRI images,
  wherein the circuit is configured to use the RIENA protocol, and wherein the RIENA pulse sequence and protocol includes:
  electronically generating an RF pulse sequence having a defined echo-planar gradient waveform with a first RF pulse excitation and associated first repetition time (TR) and subsequent second RF pulse excitations and associated TRs;
  electronically acquiring a low resolution spherical or Cartesian EPI navigator image in each TR;
  electronically obtaining multiple ky-lines of segmented high-resolution k-space data with the echo-planar gradient waveform of the generating step, with an associated echo train length (ETL) chosen to accelerate acquisition without introducing noticeable EPI geometric distortions;
  electronically comparing the low-resolution spherical or Cartesian navigator images measured across multiple TRs to characterize patterns of intra-scan motion;
  electronically phase-correcting the acquired k-space data in each TR period using information derived from the EPI navigator images, wherein each TR period corresponds to a single segment of multi-shot segmented EPI; and
  electronically averaging multiple phase-corrected images to generate an image with high SNR (Signal to Noise Ratio) and reduced motion-induced artifacts.

13. An image processing circuit configured to electronically generate MRI images using an Echo-Planar Double-Echo Steady State (EP-DESS) pulse sequence and/or a Repeated Imaging with Echo-planar Navigation and Acceleration (RIENA) pulse sequence and image processing protocol to generate clinical MRI images,
  wherein the circuit is configured to generate the MRI images using the EP-DESS pulse sequence by directing an MR Scanner to electronically generate a pulse sequence having a defined single-shot or multi-shot segmented echo-planar gradient waveform with a first RF pulse excitation and associated first repetition time (TR) and a subsequent second RF pulse excitation and associated second TR, and wherein the circuit is configured to (a) acquire multiple ky lines in each RF pulse TR to thereby improve scan efficiency and temporal resolution; (b) asymmetrically refocus signals in readout acquisition windows associated with the first and second excitation pulses so that, in the second and subsequent TRs, signals from two different coherent pathways, one based on the current RF pulse excitation and one based on the immediately prior RF pulse excitation, are refocused at different locations of EPI readout acquisition windows; (c) obtain a first echo image associated with one of the coherent pathways and a second echo image associated with the other coherent pathway; and (d) generate a composite MRI image based on data from the echo images.

14. The circuit of claim 13, wherein the circuit is configured to generate an RF pulse immediately after a non-zero phase accumulation value associated with a prior RF pulse, and wherein the circuit is configured to generate the EP-DESS pulse sequence so that first and second phase accumulation patterns do not overlap during a respective TR, resulting in echo signal formation at different locations of a respective EPI readout acquisition window.

15. The circuit of claim 13, wherein the first echo image is T2* weighted with a first time constant and the second echo image is also T2* weighted with a second time constant, wherein the first time constant is different from the second time constant.

16. The circuit of claim 12, wherein the circuit is at least partially integrated into or in communication with at least one of: (a) the MR Scanner; or (b) a clinician workstation.

17. A data processing system comprising non-transitory computer readable storage medium having computer readable program code embodied in the medium, the computer-readable program code comprising:
  computer readable program code configured to provide at least one of the following:
  (i) an Echo-Planar Double-Echo Steady State (EP-DESS) pulse sequence; and (ii) an Echo-Planar Double-Echo Steady State (EP-DESS) pulse sequence with a Repeated Imaging with Echo-planar Navigation and Acceleration (RIENA) pulse sequence and image processing protocol,
  wherein the computer readable program code of the data processing system is configured to generate the MRI images using the EP-DESS pulse sequence by directing an MR Scanner to electronically generate a pulse sequence having a defined single-shot or multi-shot segmented echo-planar gradient waveform with a first RF pulse excitation and associated first repetition time (TR) and a subsequent second RF pulse excitation and associated second TR, and (a) acquire multiple ky lines in each RF pulse TR to thereby improve scan efficiency and temporal resolution; (b) asymmetrically refocus signals in readout acquisition windows associated with the first and second excitation pulses so that, in the second and subsequent TRs, signals from two different coherent pathways, one based on the current RF pulse excitation and one based on the immediately prior RF pulse excitation, are refocused at different locations of EPI readout acquisition windows; (c) obtain a first echo image associated with one of the coherent pathways and a second echo image associated with the other coherent pathway; and (d) generate a composite MRI image based on data from the echo images.

18. The data processing system of claim 17, further comprising computer readable program code configured to generate clinical MR images using image data obtained from both the EP-DESS pulse sequence and the RIENA pulse sequence and image processing protocol to thereby generate motion-insensitive high SNR clinical images.

19. The image processing circuit of claim 12, wherein the circuit is configured to electronically generate MRI images the EP-DESS pulse sequence with the REINA protocol to generate the clinical MRI images whereby both navigator-echoes and EP-DESS are repeatedly acquired and apply a post-image acquisition image processing protocol to inhibit motion artifacts.

* * * * *

UNITED STATES PATENT AND TRADEMARK OFFICE
CERTIFICATE OF CORRECTION

PATENT NO. : 9,612,301 B2  
APPLICATION NO. : 13/982609  
DATED : April 4, 2017  
INVENTOR(S) : Chen Page 1 of 1

It is certified that error appears in the above-identified patent and that said Letters Patent is hereby corrected as shown below:

On the Title Page

Item (54): Should read -- HIGH-THROUGHPUT AND MOTION INSENSITIVE MRI ACCELERATED WITH MULTI-ECHO ECHO PLANAR ACQUISITION AND RELATED SYSTEMS --

In the Specification

Column 1, Line 1: Should read -- HIGH-THROUGHPUT AND MOTION INSENSITIVE MRI ACCELERATED WITH MULTI-ECHO ECHO PLANAR ACQUISITION AND RELATED SYSTEMS --

Column 10, Line 27: Delete "$10_1$, $10_2$, $10_1$" and insert -- $10_1$, $10_2$, $10_3$ --

Column 12, Line 49: Delete "with the SPUR." and insert -- with the SPGR. --

Column 13, Line 13: Delete "previous RE pulses" and insert -- previous RF pulses --

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*